INVENTOR
WILLIAM J. KING
CLAUD M. KELLETT
BY Francis J. Thornton
ATTORNEY

INVENTOR
WILLIAM J. KING
CLAUD M. KELLETT
BY Francis J. Thornton
ATTORNEY

United States Patent Office 3,383,567

Patented May 14, 1968

3,383,567

SOLID STATE TRANSLATING DEVICE COMPRISING IRRADIATION IMPLANTED CONDUCTIVITY IONS

William J. King, Reading, and Claud M. Kellett, Lexington, Mass., assignors to Ion Physics Corporation, Burlington, Mass., a corporation of Delaware Filed Sept. 15, 1965, Ser. No. 487,416
7 Claims. (Cl. 317—234)

ABSTRACT OF THE DISCLOSURE

A solid body composed of material having a critical temperature which renders it unsuitable for diffusion or alloying selected from the group consisting of diamond, titanium, sulfur, selenium, phosphorous, arsenic, tellurium, tin, bismuth, antimony, their compounds and their oxides, carbon, boron, boron carbide, zinc and cadmium in which ions have been implanted by irradiation to create in the body a zone whose characteristics, by virtue of the implanted ions, are varied from the characteristics of the unimplanted body.

This invention relates generally to the manufacture and fabrication of semiconductor devices, and more particularly to the utilization of novel materials in the device structure and to the novel structures resulting therefrom.

Electronic translating devices are now known in which a body of semiconducting material is provided with impurity elements in its crystal structure which alter the electrical conductivity characteristics of the body, in order to influence the flow of electrical current carriers through the device. Active devices, such as transistors, and rectifying diodes are built by providing in such materials adjacent zones having different electrical conductivity characteristics. The type of impurity material used may be either N-type in which the conduction occurs by electrons or P-type in which the electrical conduction takes place principally by the flow of holes. For example, in either germanium or silicon, traces of impurity materials of the third group of the periodic table give rise to P-type or hole conduction, and impurity materials from the fifth group give rise to N-type or electron conduction. A zone in the device is thus designated P or N depending upon the predominance of the impurity materials contained therein. The interface between the adjacent zones is designated as a P-N junction or barrier.

Over the years, many different techniques and processes for producing such conductivity zones in devices have been developed and made of great use in practical devices. One such process employs alloying in which materials such as indium, gallium, aluminum, antimony, and the like, have been alloyed or melted into the body of semiconductor material. This alloying is achieved by heating the semiconductor body to a temperature which is higher than the eutectic temperature of the two materials but lower than the melting point of the semiconductor material alone. A second valuable and widely used technique employs diffusion which occurs when a diffusion source, such as a gas or vapor of the impurity material, is presented to the semiconductor substrate surface which in the case of silicon, is held at a temperature in the order of 1,000° C.

The previously described techniques of alloying and diffusion have been found to be extremely useful in producing passive devices, such as resistors, and active devices, such as transistors, from both germanium and silicon bodies. The devices so made are in wide use today.

However, these diffusion and alloying techniques fail completely when working with the more exotic semiconducting materials, such as diamond, tellurium, or titanium dioxide (rutile).

Such materials have been predicted to be capable of forming devices with certain desirable characteristics. However, each such known exotic material has an inherent property which prevents the using of the known junction producing techniques of alloying and diffusion. For example, tellurium is an elemental hexagonal-type lattice semiconductor with an energy gap of 0.38 electron volt suitable for infrared applications.

This material has, however, not been seriously considered by previous workers in the semiconductor field for no one could produce, in it, the necessary barrier junction. The known techniques of diffusion or alloying fail completely, for this material is stable only at temperatures below 452° C.

Diamond, on the other hand, has a band gap of 5.6 electron volts, which means that a P-N junction produced therein would retain its rectification properties at temperatures in excess of 500° C. In contrast, germanium devices, for all practical purposes, lose their rectification properties before reaching 125° C. Silicon devices having a band gap wider than germanium do not fail until reaching 250° C.

Although diamond can withstand higher temperatures than germanium and silicon, it is an allotropic form of carbon which is basically metastable. Therefore, when diamonds are heated to about 1,500° C., in air, at atmospheric pressure, they convert to graphite, a stable form of carbon, which does not, because of its lattice structure, have semiconducting properties. Because of this and because any meaningful diffusion or alloying of diamond should only occur at temperatures higher than 1,500° C., no one has been able to produce an active device in a diamond body by the previously known alloying or diffusion methods and techniques, although workers, in this field, have found surface rectification occurring between diamonds and certain metal contacts on their surfaces. Thus methods known and used for other semiconductors completely failed in the case of diamond, even when such alloying and diffusion was attempted at high pressures which will prevent the diamond from converting to graphite. Therefore, although such diamonds have been theoretically predicted to be capable of providing excellent semiconductor device characteristics, none have been produced, prior to the present invention, for it has heretofore been impossible to adequately dope the material so as to produce in the body of diamond a P-N junction.

Still different materials have different properties which prevent formation of barrier junctions therein by the previously attempted diffusion techniques. For example, when titanium dioxide is heated, the oxide thermally decomposes which results in the introduction of donor "impurities" in the form of an excess of the metallic constituents of the oxide. This excess may be present as interstitial atoms accompanied by oxygen vacancies; thus diffusion or alloying of such materials is impossible because of this production of N-type impurities even while P-type impurities are being diffused in.

One additional method of producing rectification by the introduction of low energy ions in diffusible materials such as silicon, germanium and the three-five compounds was reported. Although this technique worked for diffusible materials, such as silicon, etc., the more exotic undiffusible semiconductors with which this invention is concerned were excluded from consideration.

There are many reasons for such an exclusion. One reason was the lack of available information on the materials under discussion. For example, in the case of diamond, it was predicted by early workers in the semiconductor field that diffusion of diamonds could create useable junctions if the diffusion was performed at ambient pressures high enough to keep the diamond from transforming into graphite. This was attempted and failed each time it was tried.

Such failures probably resulted from the fact that the solid solubility of the necessary N-type dopants is insufficient to overcome the natural P-type dopants appearing in the diamond sample. Thus, the N-type dopants may enter the sample while it is held at a high temperature and under a high pressure but will segregate out of the sample onto its surface or to inactive regions, such as grain boundaries, once the temperature is lowered and the pressure relieved. Therefore, any junction that may have been created is destroyed.

In other exotic semiconductors, such as zinc selenide and cadmium sulfide, a phenomenon known as vacancy compensation occurs and the formation of a P-N junction is prevented whenever diffusion is attempted. This effect may be best understood from the following illustration. If aluminum (an N-type dopant) is added to a zinc selenide crystal by means of diffusion, to form donors in the crystal, a zinc vacancy (a double P-type dopant) is formed for each two aluminum atoms incorporated. This zinc vacancy balances the incorporated aluminum atoms. This phenomenon occurs because the crystal lattice strives to get into the state of lowest energy.

These failures of diffusion lead to the belief that useable barrier junctions could not be achieved by any means in such exotic semiconductor materials. Thus, based on these experiences and beliefs, there was no reason to assume that ion implantation would succeed where diffusion had failed and that ion implantation could result in the production of useable junction barriers in such materials.

Another basic reason for failure of the prior art in exotic materials to produce a useful rectifying junction, even when ion implantation was attempted, was the failure to control the surface concentration of the implanted regions. It has long been known to the semiconductor art that to obtain meaningful contacts to the various regions of a device the surface carrier concentration must be high. This optimizing of the surface conditions was unobtainable by any of the prior art techniques of ion implantation and the problem of creating useable barrier junctions in the exotic semiconductors thus remained unsolved until the present inventors worked on the problem and succeeded in providing useable barrier junctions in such materials by means of the present invention.

The present invention, therefore, avoids all the previously encountered difficulties for it succeeds in forming in such exotic semiconductors useful barrier junctions without heating the material to diffusion or conversion temperatures or increasing its ambient pressure or creating unuseable deep lying levels.

Accordingly, the present invention is especially directed towards a method of producing selected conductivity regions separated by barrier junctions in materials, such as diamond, which hitherto have been impervious to known techniques and towards the unique devices which result therefrom.

Furthermore, the invention produces unique semiconductor devices which differ markedly in their characteristics and properties from any known to the prior art.

Still further, the invention provides a means whereby a body of exotic semiconductor material may be provided with seelcted electrical characteristics.

Also, the invention provides a means whereby exotic semiconductor devices with hitherto unattainable characteristics can be produced.

Broadly speaking, these and other highly desirable results are accomplished by providing in bodies of material unsuitable for diffusion or alloying at least one modified region by implantation of ions.

The invention and the means for producing it and its further advantages and features will be better understood as the following description proceeds taken in conjunction with the accompanying drawings wherein.

Figures 1, 2, 6:
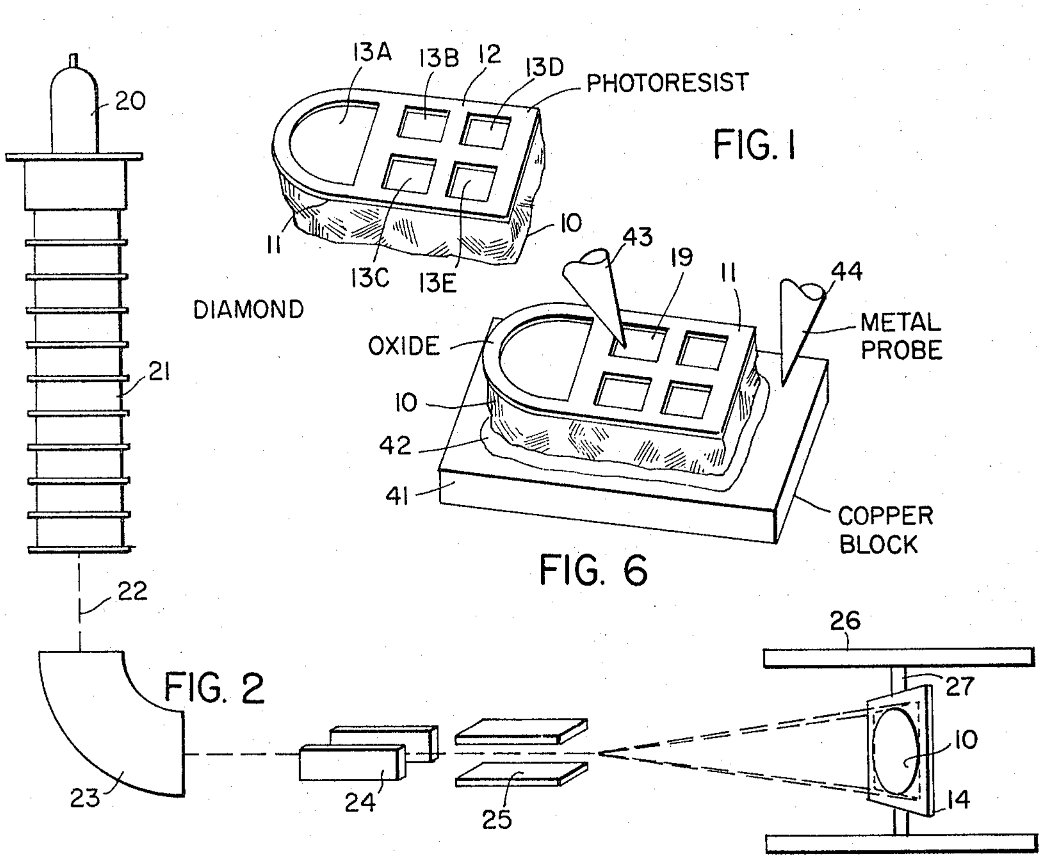
FIGURE 1 is a drawing of an actual diamond sample prepared for the implantation of an impurity therein.
FIG. 2 is a schematic view of the implantation apparatus used.
FIG. 6 depicts the sample in the testing aparatus.

Referring now to the drawings and more particularly to FIGURE 1 thereof, there is shown an assembly of an exotic undiffusible semiconductor body, such as P-type diamond, having on one surface thereof a protective layer 11 of the sputtered quartz approximately 1,000 angstroms thick. Such P-type diamonds are found in nature but also may be formed synthetically and are commercially available. The method of sputtering layers, such as quartz, is fully described in a copending application of William King, Serial No. 464,365 filed June 16, 1965, and assigned to the same assignee as the present invention.

Layer 11, following deposition is masked by using a standard photoresist material, such as is commercially available under the trade name KPR. Other materials for masking, such as wax, may also be used. However, photoresist material is preferred since sharper resolution of the masked areas may be achieved. This masking leaves uncovered window areas 13*a* to *e*. Following these preparatory steps, the crystal 10 is mounted on a sample holder 14 by means of a silicone grease and placed in the ion implantation apparatus shown schematically in FIG. 2.

This apparatus basically comprises an ion source 20, mounted on the top of an accelerator tube 21. From the accelerator tube 21, ions, in the form of a beam 22, emerge and pass through a momentum analyzing system, such as analyzing magnet 23. The ion beam emerging from the analyzing magnet 23 is passed through a deflection system which may be composed of horizontal beam scanner plates 24 and vertical beam scanner plates 25. The scanned beam emerges from the beam scanner plates and is directed upon the surface of the sample of diamond 10 mounted on the plate 14 which is supported in an evacuated chamber 26 by a fixture 27, so that the device is rigidly held in a plane normal to the beam.

The deflection plates in the apparatus are used to deploy the beam, so that it may be made to scan the entire face of the diamond body 10.

The ions of the beam are stopped from penetrating into the masked area by the photoresist which is made sufficiently thick to prevent the ions from passing therethrough. In those areas which are unmasked by the photoresist, certain of the ions striking the sputtered oxide surface pass through the oxide into the underlying diamond body, while others are stopped by the oxide. The depth of penetration of the ions into the sample body in the unmasked areas is a function of the energy of the impinging beam, the orientation of the crystal lattice, and the thickness of the sputtered oxide layer, while the ion concentration implanted in the sample is a function of these and also the length of time that a beam of a specified flux and energy continues to strike the surface. By controlling these variables, any desired gradient of ions may be implanted in the body.

Figure 4:
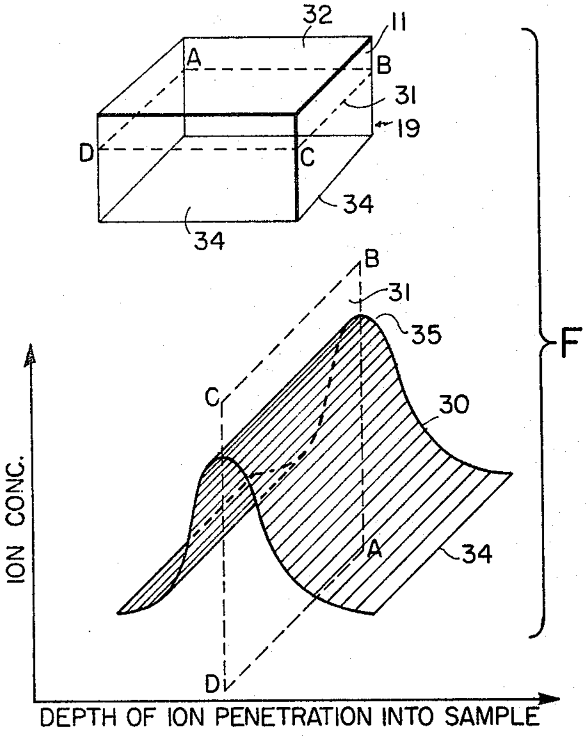
FIG. 4 is a diagram illustrating the ion concentration existing in a longitudinal cross section through the implanted region depleted in FIG. 3.
Figure 5:
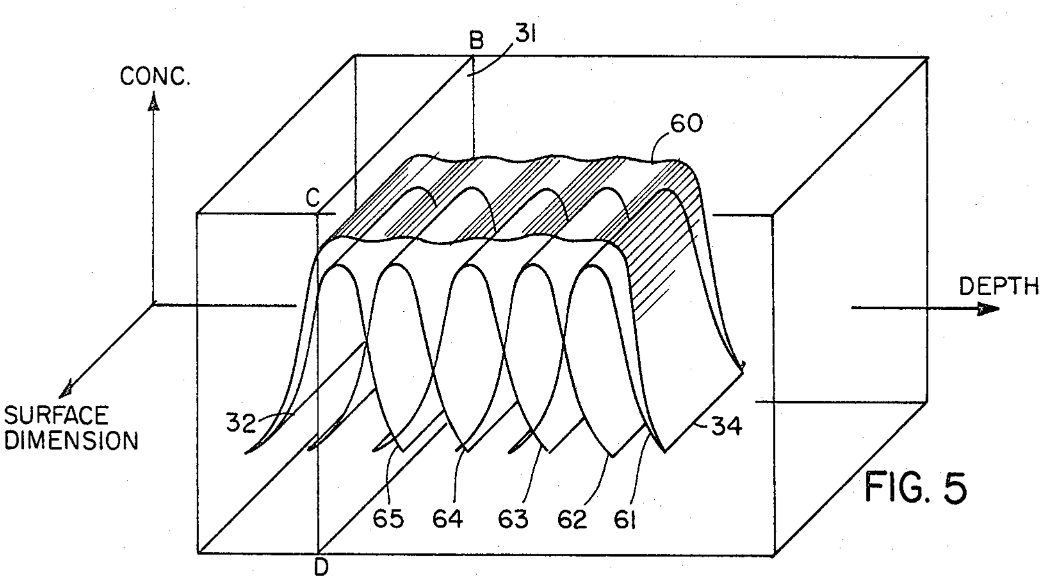
FIG. 5 illustrates the preferred ion concentration in the sample.
Figure 3:
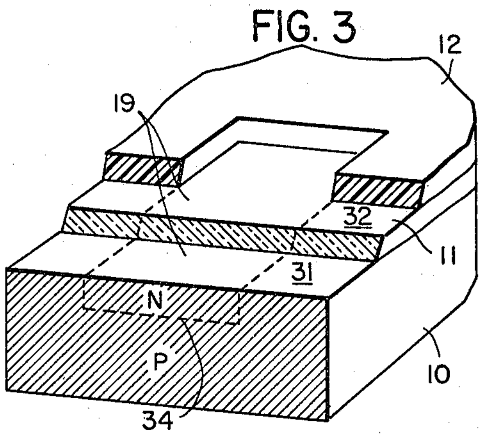
FIG. 3 is a broken two way view of one implanted area of the sample shown in FIGURE 1.

This may be more clearly understood by reference to FIGS. 3, 4 and 5 wherein there is shown various views of a typical implanted region and schematic representations of ion concentration and penetration in the implanted region 19 which underlies the window 13b, shown in FIGURE 1. The mesh-like section 30 of FIG. 4 represents the concentration of ions of one discrete energy in the device immediately after implantation and before further steps are taken. This is arranged to coincide with a pictorial view of the selected implanted area 19. Since the ions will penetrate straight into the material and not move about in the body of the material after implanation, the implanted regions have relatively sharp boundaries which give this region a box-like appearance depicted in FIG. 4. In these pictorial views, the quartz-diamond interface is represented by surface 31, the photoresist-quartz interface by surface 32 and the rectifying junction as surface 34.

When the ions of only one energy level are implanted in the body, the concentration of implanted ions versus the depth of implanation follows a normal (Gaussian) distribution. Normally, the variables such as lattice orientation, beam energy and flux, etc. are controlled so that this curve peaks at the quartz-diamond interface. This is clearly shown in FIG. 4 which depicts the implanted region 19 apart from the surrounding unimplanted regions, and a curve of ion concentration obtained by a typical implantation in that region of ions of one specified energy. The curve 30, shown in this view, was calculated so that its peak 35 fell on the quartz-diamond interface 31 shown as defined by corners A, B, C and D. This curve ends abruptly at surface 32 and at the P-N junction plane 34.

By a selective control of these variables, the obtained curve can be deformed from the normal curve shown. Thus, if desired the peak 35 can be made to fall in the sample body, in the quartz layer, or at the interface 31. Furthermore, the depth of the junction 34 can be pushed deeper into the sample body by implantation of ions of various energies.

This effect may be better understood after a discussion of the materials involved in this invention and a brief review of crystal structure.

The quartz layer 11 is amorphous when sputtered onto the surface, that is, this layer has no definite or regular crystalline structure or texture. Thus, on a statistical basis, the ions penetrating the quartz are cells impeded to the same degree.

On the other hand, the underlying semiconductor body has a regular crystalline structure. Such crystalline structures have long been studied and are known to have crystal planes which are defined by the so-called Miller indices. Certain paths perpendicular to these planes are known as low index directions. For example, in diamond, these would be the 110 and 100 directions. When ions are implanted in the crystal by beaming them along these "easy" paths, they can penetrate to depths which are up to 10 times greater than ions implanted in amorphous material. In ion implantation, this implantation along "easy" paths is known as channeling and ion implantation depths in diamond of 0.2–0.3 mm. can be obtained using 1–2 mev. beams.

In one particular experiment, the diamond being implanted had a natural P-type conduction. This meant that, to create a P–N junction, N-type ions would have to be implanted. To this end, phosphorous ions ($P^{31}$) were selected for implantation. Other ions such as arsenic or antimony could have been used.

To produce in diamond a junction depth of 1 micron and a curve of ion concentration which presents at the quartz-diamond interface the best possible ion concentration for electrode contact, ions of more than one energy had to be implanted in the sample. To this end, the sample 10 was mounted on the holder 14 so that the ion beam would enter the crystal 7° off a low index direction and the ion implantation begun with a beam whose energy was 300 kev. This beam was played on the sample for 0.448 microampere hour after which its energy was reduced to 250 kev. for the same amount of microampere hour. At the end of this time, the beam energy was again reduced by 50 kev. to 200 kev. and held at this level for the same period.

In this manner, the beam was reduced in steps of 50 kev. until a final level of 100 kev. was reached, after which the beam was shut off and the sample removed from the chamber. This stepped reduction of the energy level of the beam resulted in an average ion concentration of $5\times10^{19}$ ions of $P^{31}$ per cubic centimeter in the diamond sample and a P-N junction about 1 micron below the quartz-diamond interface. This described procedure resulted in an ion concentration of the implanted region as shown in FIG. 5.

In this figure, the individual curves of each ion implantation described above are shown as curves 61, 62, 63, 64 and 65, respectively. This sequence of implantation results in an ion concentration of the implanted region represented by curve 60. This resultant curve 60 is a summation of all the curves 61 through 65. Although this curve 60 is shown with distinct ripples, these can be eliminated by implantation of ions having different energies or by smaller differences betwen each ion implantation. In any case, the described technique resulted in a perfectly adequate device as will become apparent from the discussion of the test results which follows later in the specification.

It should be understood that the described voltage levels were given for phosphorous ions and that the required energy levels for other ions will vary from those described. For phosphorous ions, the lowest useful energy level for ion implantation through a surface layer is 50 kev. which gives the ion a velocity in excess of $10^7$ cm./sec. Energies below this level cause sputtering away of the protective quartz layer with deleterious results. Thus, no ion being implanted should be permitted to have an energy level such when the ion strikes the surface of the device, sputtering would occur. On the other end of the scale, the energy of the ions, to be implanted, is dependent on the depth of the desired junction, the crystal orientation, etc.

Because of slight variations in the stopping points of the implanted ions, the junction was graded in a most desirable manner. The slight variation, in the final resting place of the ions, is determined by the probability of the ions striking atoms in the lattice, the effect of electron stripping caused by passage of the ions, etc.

The final ion concentration in the implanted region of the actual sample was determined by the envelope 60 which results from the added effects of all the curves 61, 62, 63, 64 and 65, shown in FIG. 5.

After implantation and removal from the chamber, the photoresist and silicone grease were removed from the sample surface by the dipping of the sample in a degreaser, such as trichloroethylene. At this time, visual inspection of the sample showed that the implanted areas had a color distinctive from the color of the basic sample. In this particular instance, the implanted regions had a slight brownish tinge while the unimplanted regions retained their normal light green color. Following cleaning, the sample was placed in a standard industrial furnace and heated at 600° C. for one hour.

It has been found, for diamond, that better devices are obtained if they are heated in the above-described manner. The full reason for the better results achieved by this annealing step is not fully known but it is believed that the initially implanted ions are interstitial in the lattice structure and that the heating imparts sufficient energy to the ions to permit them to move into vacancies existing in the lattice structure becoming substitutional ions. Such heating further cures any radiation damage and relieves any possible charge concentration which if catastrophically discharged could cause structural damage to the semiconductor. This effect is only of concern in the high gap materials, such as diamond, for in the lower gap materials the charge will be equalized by free carriers.

Following the heating step, the quartz was removed by a standard etching technique using hydrofluoric acid. Since it was desired that only selected areas of the quartz to be removed, the sample surface was again masked in a manner, which corresponded to the original masking placed on the surface. Following the etching step, this masking was again stripped by dipping the unit into a trichloroethylene bath. After removal from the bath, the device was dried and mounted for testing.

The desirability of having the protective layer on the surface of the sample cannot be too strongly stressed for it is only through the use of such a layer that the failures, difficulties, and disadvantages of the prior art are avoided. To thoroughly understand this, a more complete discussion of the prior art techniques and their resultant surface states should now be given.

Basically, the severest difficulty of prior art devices was that of high surface resistivity of the treated regions. This problem does not exist in diffused or alloyed devices. For implanted regions, the ion concentration is a normal distribution. A better comprehension of the effect that this distribution has on the surface of the devices can be had by reference to FIGS. 8 and 9 which show, for diamond, the surface resistivity and surface concentration curves. The values given in such curves are dependent on the particular material under discussion but the general shape of each curve will be the same in all cases.

Figure 8:
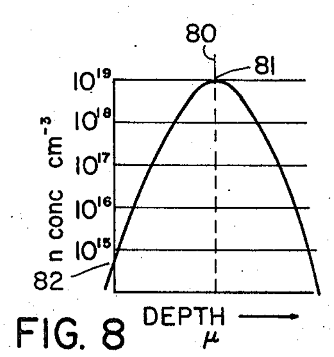
FIG. 8 is a graph showing surface concentration versus ion penetration.

FIG. 8 shows a curve of concentration of one energy range of implanted ions versus depth. If by control of the described variables, the peak of the curve is made to correspond to the quartz-diamond interface, the highest concentration in the diamond for that particular implantation will be obtained at the surface of the implanted region. In this figure, the interface is depicted by dotted line 80 which intersects the curve at point 81. If an oxide layer were not used, it is seen that the surface concentration would be in the order of $10^{15}$ ions/cm.$^3$ as indicated by arrow 82.

Figure 9:
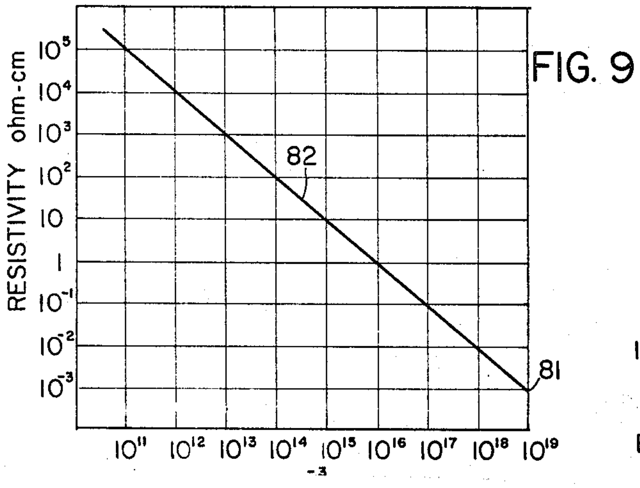
FIG. 9 is a graph showing surface resistivity versus ion concentration.

By reference to FIG. 9, it is seen that this difference in surface concentrations results in widely different surface resistivities, with the highest surface concentration, shown by point 81, having the lowest surface resistivity, and the lower surface concentration, shown by point 82, having the highest surface resistivities.

As is well known, better ohmic contacts can be made to surfaces which have the higher surface concentrations and in the described case the higher surface concentrations were obtained by the removal of the oxide in those areas to which contacts were to be made.

Furthermore, the amorphous oxide layer provides still another advantage which will become clear from the following discussion. Impact of ions on a regular crystalline surface causes large amounts of damage such that the surface ultimately becomes amorphous. This damage to the surface cannot be removed by any known method and has a deleterious effect on the created device in that it reduces the lifetime of the material which results in lower forward currents, lower reverse breakdown voltages and lower mobility of the minority carriers. Such a highly damaged surface layer will, when it extends across the edges of the junction where they meet the surface, act as a drain of such minority carriers which is deleterious to active devices, like transistors, etc.

Use of a protective layer prevents such massive surface damage to the underlying crystalline body. The ions which penetrate into the body do cause some microscopic damage which is removed by the annealing step. The removal of such microscopic damage results in a reduced resistivity in the bulk material, improved lifetime, higher mobility of carriers, higher forward currents and lower reverse leakage currents.

The testing arrangement used is shown in FIG. 6, which depicts the sample 10 secured to a copper block 41 by a conductive silver paste 42. A metal probe 43 is in contact with the exposed surface of the implanted area 19, and a second probe 44 is in contact with the copper block. As shown in this view, the oxide layer 11 remained on the surface of the unimplanted areas. Although probes are shown as the contacts, in this view, it should be understood that this use of probes was for experimental purposes only and that, generally, a metallic conducting layer, such as nickel, would be deposited on the exposed surface of the implanted areas by means of the well-known sputtering technique. Furthermore, other means of making contact to the unimplanted region could be made. For example, in place of the silver paste, metal could also be sputtered on in a normal manner.

It has been found that better ohmic contacts can be made to the bulk crystal material if an implantation of P-type ions is made in those areas to which base contact is to be made. This comes about because of higher surface concentrations, which can be obtained by such implantation. As previously mentioned, higher surface concentrations permit the formation of better ohmic contacts.

Figure 7:
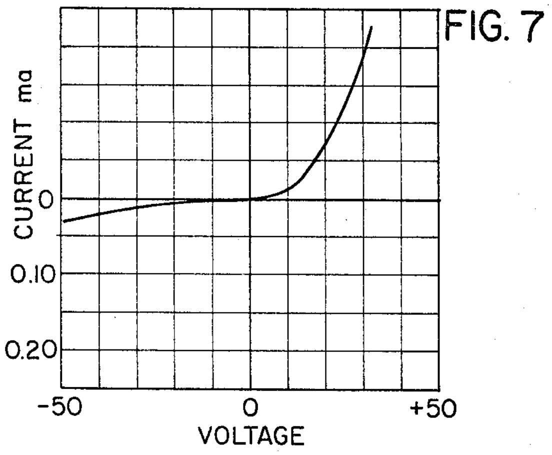
FIG. 7 is a graph showing the reverse and forward characteristics obtained in the diode structure fabricated in accordance with the present invention.

By use of the arrangement shown in FIG. 6, the curve depicted in FIG. 7 was obtained on a standard transistor curve tracer, while the diamond was at room temperature, i.e., 25° C. This curve clearly indicates that a true diode action with rectification was achieved. From more detailed four-terminal (probe) measurements, it was found that the forward curve knee occurred between five and six volts as predicted by theoretical considerations. The reverse characteristics of the device were not carried out to breakdown. The highest applied reverse voltage was 95 volts at which the leakage current was but $3.15\times10^{-4}$ amperes.

This completes one method of making a rectifying junction in a diamond body. The method given in this embodiment may be modified in many ways. For example, other impurity ions other than phosphorus could be introduced into the body. Furthermore, if an intrinsic diamond body were being used as the sample, either a P-type or N-type implantation could be made in the body to provide a base region and a second implantation of opposite conductivity type carriers could be then implanted to form a rectifying function.

Although a quartz layer has been described as preferable, any material may be used provided it can absorb a sufficient number of ions, such that when it is cleaned from the surface the desired surface concentration of ions will be achieved. Other suitable materials are organic polymers, liquids, such as mercury or diffusion pump oil, which have a low vapor pressure and metal films which are no thicker than 0.1 micron.

Also, other means of applying the contacts and other metallic contacts other than those described could also be employed. For example, contacts may be plated onto the exposed areas, as is well known in the prior art, and many other materials, such as aluminum or gold, could be conveniently used for making intimate contact to both the implanted regions and to the original base region.

Also, it should now be obvious to one skilled in the solid state art that the described technique can be used to form all types of active and passive devices in a diamond body. Typically such devices would include all types of solid state devices such as transistors, diodes, resistors, integratde circuits, etc.

Still further, such ion implantation techniques can be used to form, in other hitherto unworkable material, selected regions of any desired electrical conductivity and barrier junctions.

Besides the previously mentioned exotic undiffusible materials, there are others which have similar drawbacks. The described ion implantation technique, however, will succeed with such materials when certain precautions to be later described are taken.

A listing of such materials in the order of their band-gap width is given below:

| Group | Material | Energy Gap in EV | Critical Temp., ° C. |
|---|---|---|---|
| IV | Diamond | 5.6 | 1,500 |
| IV-VI | Titanium dioxide (rutile) | 3.7 | 820 |
| II-VI | Zinc selenide | 2.7 | >1,100 |
| V | Sulfur (α phase) | 2.6 | [1] 119 |
| II-VI | Cadmium sulfide | 2.5 | [1] 1,027 |
| V | Phosphorus (yellow) | 2.1 | [1] 34 |
| VI | Selenium (red) | 1.6 | [1] 230 |
| V | Phosphorus (red) | 1.6 | [1] 44 |
| III | Boron | 1.5 | >2,000 |
| V | Arsenic (gray) | 1.2 | 615 |
| V | Phosphorus (black) | 0.4 | [1] 44 |
| VI | Tellurium | 0.38 | 452 |
| V | Antimony (β phase) | 0.11 | 630 |
| III-IV | Boron carbide | 0.13 | 2,350 |
| IV | Tin (α phase) | [1] 0.08 | [1] 18 |
| V | Bismuth | ? | 271 |

[1] Approx.

As can be determined from a brief perusal of the above list, the limiting factor, in most cases, is the critical temperature of the material which is defined as that temperature at which the material melts, sublimes or converts to another form. In other materials, such as boron and diamond, there is no apparent reason why these cannot be diffused. The phenomena preventing diffusion in other materials, such as zinc selenide, has already been described.

When treating these materials to form a junction by the described invention, the following precautions must be taken.

Firstly, the material must be kept at a temperature well below its critical temperature. In the case of phosphorus, for example, a suitable temperature would be in the range of −40° C. or lower. Temperatures less −40° C. are easily obtained by means of treatment with frozen carbon dioxide, better known as Dry Ice.

Secondly, the annealing step must be accomplished in a manner significantly different from that described for diamond. In the case of the low temperature materials, such as phosphorus, one method of annealing can, for example, be accomplished by a series of electrical pulses which are of such a short duration that they do not succeed in heating the volume of the material above its critical temperature. For each material, the time of such pulses, and the electric fields created, must be calculated and depends upon the resistivity of the material.

It should be, of course, understood that in each case, to create a junction, the type of implanted impurity ion must be opposite that of the type presently existing in the basic body. For example, since boron is naturally P-type, it must be treated with an N-type impurity. On the other hand, titanium dioxide (rutile) is naturally N-type and must be treated with a P-type impurity.

To create resistors and the like, the body could be treated with the same type or opposite type impurities so as to vary the resistivity and thus the conductivity of the treated region.

Therefore, having thus described at least one complete embodiment of the present invention, and since other modifications and variations will now become apparent to those skilled in the art, it is respectively requested that the described invention be limited only by the following claims.

What is claimed is:

1. A semiconductor device comprising a body of semiconductor taken from the group consisting of diamond, titanium dioxide, boron, sulfur, selenium, phosphorus, arsenic, tellurium, antimony tellurium, tin, and bismuth; having a passivating layer on the surface thereof comprising at least one zone of a first conductivity type, a second zone of an opposite conductivity type; said second zone of opposite conductivity type, being a region of bombardment implanted substitutional ions of an impurity element characteristic of the conductivity of said zone; and a rectifying barrier separating said one and second zones.

2. A device comprising a body of solid material taken from the group consisting of diamond, titanium, sulfur, selenium, phosphorous, arsenic, tellurium, tin, bismuth, antimony, their compounds and their oxides, said body having at least one region of one conductivity type material, said region containing substitutional conductivity producing ions of said conductivity type and said ions being bombardment implanted in said region.

3. The device of claim 2 wherein said body comprises semiconducting material.

4. The device of claim 2 wherein said body is of a first conductivity type, said ions are of a different conductivity type and a rectifying junction separates said region from the remainder of the body.

5. The device of claim 4 further having conducting leads connected electrically to said region and said body.

6. The device of claim 2 wherein said body has a conductivity, at room temperature, in the range of $10^{-22}$ mho-cm.$^{-1}$ to $10^{2}$ mho-cm.$^{-1}$ and said region has a conductivity beyond $10^{-5}$ mho-cm.$^{-1}$.

7. A device comprising a body of solid material taken from the group consisting of diamond, carbon, boron, boron carbide, zinc and cadmium, said body having at least one region of one conductivity type material, said region containing substitutional conductivity producing ions of said conductivity type and said ions being bombardment implanted in said region.

References Cited

UNITED STATES PATENTS

| | | | |
|---|---|---|---|
| 2,666,814 | 1/1954 | Shockley | 317—235 |
| 2,842,466 | 7/1958 | Moyer | 317—235 |
| 3,293,084 | 12/1966 | McCaldin | 317—235 |
| 3,317,354 | 5/1967 | Darrow et al. | 148—1.5 |
| 3,341,754 | 9/1967 | Kellett et al. | 317—235 |

OTHER REFERENCES

Physical Review, vol. 137, No. 5A, March 1, 1965, article entitled "Semiconducting Diamond by Ion Bombardment," pages A1614, A1615, and A1616.

JAMES D. KALLAM, *Primary Examiner.*